United States Patent [19]
Maruyama et al.

[11] Patent Number: 5,882,401
[45] Date of Patent: Mar. 16, 1999

[54] METHOD FOR MANUFACTURING SILICON SINGLE CRYSTAL SUBSTRATE FOR USE OF EPITAXIAL LAYER GROWTH

[75] Inventors: Tamotsu Maruyama, Vancouver, Wash.; Hiroki Ose, Annaka, Japan

[73] Assignee: Shin-Etsu Handotai Co., Ltd., Tokyo, Japan

[21] Appl. No.: 908,963

[22] Filed: Aug. 8, 1997

[30] Foreign Application Priority Data

Aug. 27, 1996 [JP] Japan ................................. 8-225517

[51] Int. Cl.⁶ ..................................................... C30B 25/02
[52] U.S. Cl. ................................ 117/97; 117/95; 117/98; 117/106
[58] Field of Search ................................... 117/84, 90, 94, 117/95, 97, 98, 106; 427/690, 694

[56] References Cited

U.S. PATENT DOCUMENTS 5,429,711  7/1995  Watanabe et al. ...................... 438/464
5,658,618  8/1997  Schaffer et al. ........................ 427/444
5,672,185  9/1997  Ryoke ..................................... 51/295

FOREIGN PATENT DOCUMENTS

A-62-128520  6/1987  Japan .

Primary Examiner—Felisa Garrett
Attorney, Agent, or Firm—Oliff & Berridge,PLC

[57] ABSTRACT

A method for manufacturing a silicon single crystal substrate for use of an epitaxial layer growth. The method comprises the steps of: growing a CVD film on a rear surface and a peripheral side portion, of the silicon single crystal substrate; removing a portion of the CVD film on the peripheral side portion in the vicinity of a main surface of the silicon single crystal substrate, which was grown over an end of the peripheral side portion, by an abrasive tape grinding; and thereafter mirror-polishing the main surface of the silicon single crystal substrate.

14 Claims, 4 Drawing Sheets

METHOD FOR MANUFACTURING SILICON SINGLE CRYSTAL SUBSTRATE FOR USE OF EPITAXIAL LAYER GROWTH

BACKGROUND OF THE INVENTION

1. Field of the Invention

The present invention relates to a method for manufacturing a silicon single crystal substrate, in particular, to a method for manufacturing a silicon single crystal substrate which is used for growing an epitaxial layer thereon in vapor phase.

2. Description of Related Art

A silicon single crystal substrate (hereinafter, which may be simply called "substrate") is manufactured by slicing, etching and polishing a substrate into which boron (B) for functioning as acceptors, or phosphorus (P), arsenic (As) or antimony (Sb) functioning as donors, were added as dopants. Usage of an epitaxial wafer is available for the measure of latch up or α-ray soft error, for a MOSLSI device. Such an epitaxial wafer is manufactured by growing a lightly doped epitaxial layer having a dopant concentration of about $1 \times 10^{15}$ atoms/cm$^3$ upon a heavily doped silicon single crystal substrate having a dopant concentration of about $7 \times 10^{18}$ atoms/cm$^3$ in vapor phase.

During a vapor phase epitaxial growth upon a silicon single crystal substrate heated at a high temperature in a hydrogen atmosphere in order to manufacture an epitaxial wafer, chiefly, the rear surface of the substrate is etched by the hydrogen, so that dopants which were heavily added into the substrate are discharged into the vapor phase. The discharged dopants in the vapor phase are trapped within the vapor phase growing epitaxial layer again, that is, the so-called autodoping phenomenon is caused, to make the concentration of dopants in the epitaxial layer non-uniform. In order to suppress the autodoping phenomenon, in a conventional manufacturing method, a protection film of silicon dioxide or silicon nitride is formed on the rear surface of the silicon single crystal substrate to prevent the substrate from being etched by the hydrogen.

However, when forming the protection film on the rear surface of the silicon single crystal substrate by a CVD method (chemical vapor deposition method) using an apparatus 30 shown in FIG. 4, the raw material gas reaches the main surface side of the substrate 10 over the periphery thereof to grow a CVD film 41 thereon, as shown in FIG. 5. Although the grown CVD film 41 on the main surface of the substrate 10 can be removed by a following mirror-polishing step, the grown CVD film 41 on the peripheral side surface thereof remains. In FIG. 4, the apparatus 30 is a continuous processing type of CVD apparatus, the reference numeral 31 denotes a substrate holder, the reference numeral 32 denotes a heater, and the reference numeral 33 denotes a raw material gas feeder. When the CVD film 41 is formed on the side surface adjacent to the main surface of the substrate 10, abnormally grown grain-mass-like polysilicon 45, i.e., the so-called nodules, are formed on the side surface through the CVD film which is porous, during the vapor phase epitaxial growth, as shown in FIG. 6. Such nodules can contribute to generation of particles by separating from the epitaxial wafers during carrying them or the like, or to occurrence of an extraordinary growth what is called a crown 46 which is created in the peripheral portion of the substrate.

For this reason, for example, as described in Japanese Patent Application Publication (Laid-open) No. Tokukai-sho 62-128520, such a protection film 41 has been removed over the whole side surface of the silicon single crystal substrate by using a chemical etching process or a mechanical polishing process, as shown in FIG. 7.

In the case of using a chemical etching process, a cloth impregnated with an etchant is pressed against the peripheral surfaces and peripheral side portion to remove the protection film. However, such a process has the problem that an epitaxial layer having a non-uniform distribution of dopants concentration is formed because a largely waving boundary is formed between the region from which the protection film was removed and the region on which the protection film remains, depending upon the manner of pressing of the cloth, and the amount of autodoping generated during the vapor phase epitaxial growth is locally varied. On the other hand, in the case of using a mechanical grinding process, the grinding is carried out by pressing a grinding stone which is one for grinding against the peripheral portion of the substrate. However, such a process has the problem of remaining a working damage in the ground portion of the substrate firmly, which contributes to generation of stacking faults or slip dislocations when growing of an epitaxial layer. Accordingly, it is indispensable to thereafter carry out removal of remaining working damage, for example, an alkali etching, sufficiently.

Recently, as a silicon wafer used for a power MOSFET for a switching regulator, one in which an epitaxial layer is formed on a heavily As-doped silicon single crystal substrate has been used to lower the ON-resistance thereof.

However, the higher the concentration of arsenic which are doped into the substrate, the larger the amount of autodoping from the substrate becomes, so that autodoping occurred not only from the rear surface of the substrate but also from the side surface thereof have not been negligible.

SUMMARY OF THE INVENTION

The present invention was developed in view of these problems. An object of the present invention is to provide a method for manufacturing a silicon single crystal substrate used for growing an epitaxial layer thereon in vapor phase, which is simple and can prevent occurrence of nodules effectively and can easily control the boundary between the region from which the protection film was removed and the region on which the protection film remains.

That is, in accordance with one aspect of the present invention, the method for manufacturing a silicon single crystal substrate for use of an epitaxial layer growth, comprises the steps of: growing a CVD film on a rear surface and a peripheral side portion, of the silicon single crystal substrate; removing a portion of the CVD film on the peripheral side portion in the vicinity of a main surface of the silicon single crystal substrate, which was grown over an end of the peripheral side portion, by an abrasive tape grinding; and thereafter mirror-polishing the main surface of the silicon single crystal substrate.

According to such a method, because the CVD film on the peripheral side portion in the vicinity of the main surface of the silicon single crystal substrate, which was grown by reaching of the raw material gas thereto over the peripheral end of the substrate, is surely removed by the abrasive tape grinding, there is no problem of occurrence of nodule. Further, because a CVD film remains surely on the peripheral side portion other than the above peripheral side portion in the vicinity of the main surface of the substrate, and on the rear surface, it is possible to suppress occurrence of autodoping sufficiently. It is possible to easily control the boundary between the region from which the CVD film was removed and the region on which the CVD film remains, and to form a peripheral surface with no working damage nor CVD film by only one step, and also to reduce the processing time.

Preferably, the abrasive tape grinding is carried out by rotating the silicon single crystal substrate at a rotational speed of 500–900 rpm while pressing a tape having fixed abrasive grains having a diameter of 3–9 µm thereon, against the portion of the CVD film grown on the peripheral side portion in the vicinity of the main surface of the silicon single crystal substrate.

The reason for this is that when the diameter of each fixed abrasive grain is larger than 9 µm, an additional step for removing larger damages caused by the grinding, for example, an etching with an alkali aqueous solution, e.g., KOH aqueous solution or the like, is required after the abrasive tape grinding, and the diameter of each fixed abrasive grain smaller than 3 µm is not practical because much time is required for abrasive tape grinding. The abrasive tape grinding with the rotational speed of the substrate of 500–900 rpm enables grinding a wafer in a very short time in comparison with one using a buff polishing.

The abrasive tape grinding is preferably carried out by rotating the silicon single crystal substrate at a predetermined speed while pressing a tape having fixed abrasive grains against the portion of the CVD film grown on the peripheral side portion in the vicinity of the main surface of the silicon single crystal substrate, wherein a used portion of the tape is taken up and a portion having a fresh surface of the tape is continuously supplied for grinding. Such an abrasive tape grinding may be carried out by using a tape grinding means which comprises: a rotatable drum which includes a tape supplying reel for supplying a tape holding abrasive grains thereon and a take-up reel for taking up a used tape, and around an outer peripheral surface of which the tape is wound; and a substrate holding member for holding the silicon single crystal substrate, which can bring the peripheral portion of the substrate into contact with the tape and can change a tilt angle of the substrate with respect to the tape wound around the rotatable drum.

According to a method using such an abrasive tape grinding, because the substrate is always ground by fresh surfaces of the abrasive tape supplied continuously, during grinding, there is no problem of occurrence of wear or glazing of fixed abrasive grains. Therefore, it is possible to reduce the necessary time not only for removing the CVD film but for exchanging the grinding stone.

Preferably, the silicon single crystal substrate contains arsenic with a concentration of $1 \times 10^{19}$ to $1.9 \times 10^{21}$ atoms/cm$^3$ as dopants. The reason for this is that a MOSFET having an enough low ON-resistance requires a concentration of dopants not less than $1 \times 10^{19}$ atoms/cm$^3$, however, arsenic cannot be added into a silicon single crystal to have a dopant concentration more than $1.9 \times 10^{21}$ atoms/cm$^3$.

The peripheral side portion of the silicon single crystal substrate may comprise a main surface side beveled portion, a peripheral side surface portion and a rear surface side beveled portion; and the peripheral side portion in the vicinity of the main surface may be the main surface side beveled portion. The peripheral side portion of the silicon single crystal substrate may comprise a main surface side beveled portion, a peripheral side surface portion and a rear surface side beveled portion, and the peripheral side portion in the vicinity of the main surface may comprise the main surface side beveled portion and the peripheral side surface portion. The peripheral side portion of the silicon single crystal substrate may have an arc-shaped section, and the peripheral side portion in the vicinity of the main surface may be a half of the arc-shaped section in a side of the main surface. Preferably, the CVD film comprises one selected from the group consisting of silicon oxide and silicon nitride.

In accordance with another aspect of the present invention, the method for manufacturing a silicon single crystal substrate for use of an epitaxial layer growth, comprising the steps of: growing a silicon dioxide film on a rear surface and a peripheral side portion which comprises a main surface side beveled portion, the peripheral side surface portion and a rear surface side beveled portion, of the silicon single crystal substrate, by a CVD method; removing the silicon dioxide film grown on the peripheral side portion in the vicinity of a main surface of the silicon single crystal substrate over an end of the peripheral side portion, by rotating the silicon single crystal substrate while pressing a tape having fixed abrasive grains thereon against the portion of the silicon dioxide film grown on the main surface side beveled portion or the peripheral side surface portion of the silicon single crystal substrate; and thereafter mirror-polishing the main surface of the silicon single crystal substrate.

Such a method is simple and not only can suppress occurrence of autodoping sufficiently but can prevent occurrence of nodules effectively, and can easily control the boundary between the region from which the protection film was removed and the region on which the protection film remains.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Figure 1A:
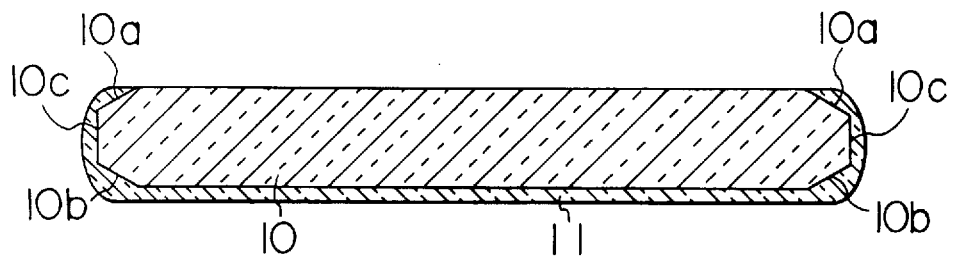
FIGS. 1A to 1C are vertical sectional views for showing steps for manufacturing a silicon single crystal substrate which is used for growing an epitaxial layer thereon in vapor phase, according to a first embodiment of the invention.

An embodiment of the method for manufacturing a silicon single crystal substrate which is used for growing an epitaxial layer in vapor phase, according to the invention will be explained with reference to FIGS. 1A to 4, as follows.

First, an embodiment of an abrasive tape grinding apparatus used for the manufacturing method of the invention will be explained with reference to FIG. 3.

The abrasive tape grinding apparatus 1 comprises a rotary drum 2 around the outer peripheral surface of which a tape T holding abrasive grains thereon is wound; a drum motor 3 for rotating the rotary drum 2; and a substrate holding mechanism 5 which has a wafer chucking disc 4 for holding a silicon single crystal substrate 10 by vacuum suction and can bring the peripheral portion of the substrate 10 into contact with the tape T wound around the periphery of the rotary drum 2. The substrate holding mechanism 5 comprises a chuck motor 6 for rotating the wafer chucking disc 4; a supporting member 7 for supporting the wafer chucking disc 4 and the chuck motor 6; a wafer inclining member 8 for changing the tilt angle of the silicon single crystal substrate 10 with respect to the tape T on the rotary drum 2 by reciprocally turning the supporting member 7 around an axis for inclination which is substantially parallel with the main surface of the substrate 10 and is shown by alternate long and short dash line in this Figure; and a turning member 9 for bringing the substrate 10 into contact with or for separating it from the tape T wound around the rotary drum 2 by turning the supporting member 7 around a turning axis 7a. Inside of the rotary drum 2, a tape supplying reel for supplying the tape T holding abrasive grains thereon and a take-up reel for taking up the used tape T are provided, and the take-up reel is driven by a motor 3a to rotate.

In the grinding apparatus, the peripheral portion of the silicon single crystal substrate 10 is pressed against the tape T by turning the supporting member 7 on the turning axis 7a by means of the turning member 9; and the tilt angle of the substrate 10 with respect to the rotary drum 2 can be changed by reciprocally rotating the supporting member 7 on a predetermined axis within an angle of rotation. As a result, a desired portion of the periphery (side surfaces) of the silicon single crystal substrate 10 can be surely polished.

Figure 1B:
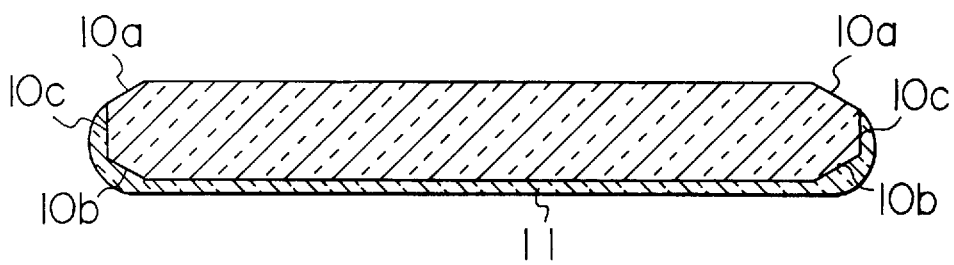
Figure 1C:
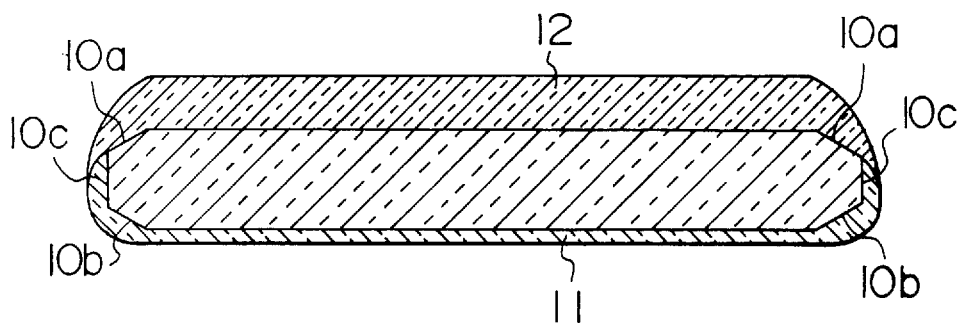

Next, a method for manufacturing a silicon single crystal substrate which is used for growing an epitaxial layer thereon in vapor phase, will be explained with reference to FIGS. 1A to 1C.

First, an n-type silicon single crystal substrate 10 into which arsenic have been added as dopants to have a concentration of about $3 \times 10^{19}$ atoms/cm$^3$ and which has a diameter of 125 mm and a main surface of crystal orientation (100) and to which a lapping treatment was carried out, is prepared. It is preferable that the concentration of dopant to be added into a substrate for manufacturing a silicon wafer used for a power MOSFET for a switching regulator is in the range of $1 \times 10^{19}$ to $1.9 \times 10^{21}$ atoms /cm$^3$. The reason for this is that a MOSFET having an enough low ON-resistance requires a concentration of dopants not less than $1 \times 10^{19}$ atoms/cm$^3$, however, arsenic cannot be added into a silicon single crystal to have a concentration more than $1.9 \times 10^{21}$ atoms/cm$^3$.

Next, to the peripheral portion of the prepared substrate 10 to which a lapping treatment was carried out, a chamfering processing is performed to form a main surface beveled portion 10a, a peripheral side portion 10c and a rear surface beveled portion 10b. The chamfered portion may be formed in another shape, for example, an arc-shaped section, as shown in FIG. 2, as occasion demands. The chamfering processing may be carried out prior to the lapping treatment.

Figure 4:
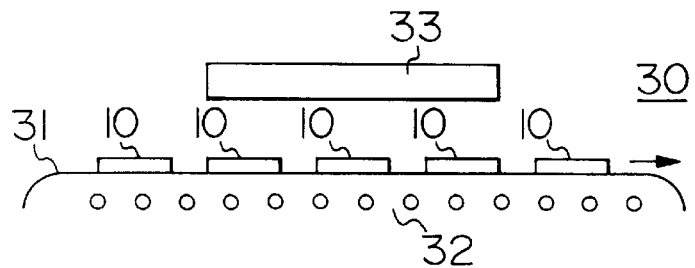
FIG. 4 is a schematic view for showing an embodiment of the CVD apparatus used for the invention.
Figure 5:
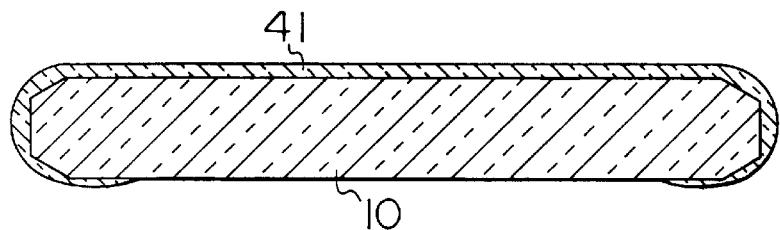
FIG. 5 is a schematic view showing a state of a silicon single crystal substrate having a CVD film which is grown on the periphery in the side of the main surface over the peripheral end of the substrate.
Figure 6:
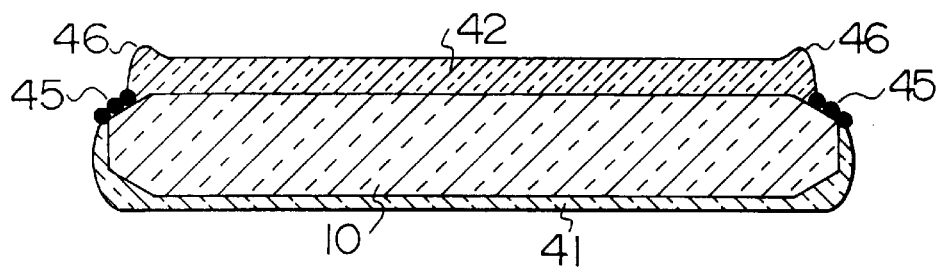
FIG. 6 is a schematic view showing a state of a general silicon single crystal substrate on which nodules and a crown are created when an epitaxial layer is grown on the substrate.
Figure 7:
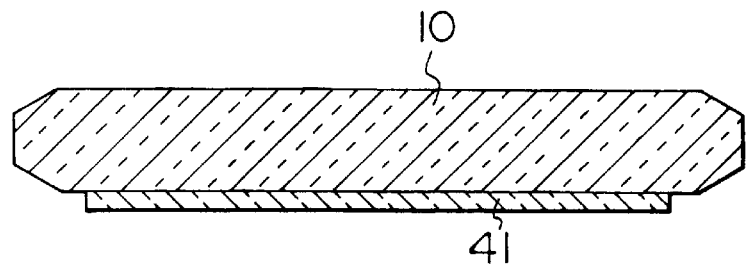
FIG. 7 Prior Art is a schematic view showing a state of a silicon single crystal substrate on which a CVD film is formed by a conventional method.

A chemical etching treatment for removing working damage is carried out to the chamfered substrate 10, and thereafter a CVD film 11 of an oxide or a nitride for preventing autodoping is formed on the rear and side surfaces of the substrate 10, for example, by processing the substrate 10 with a CVD system 30 shown in FIG. 4.

The CVD system 30 used in the embodiment is a continuous processing type, as shown in FIG. 4. In this Figure, a CVD film 11 having a thickness of 500 nm is formed on each substrate 10 by heating the substrate 10 at a temperature of 300°–500° C. by a heating member 32 with blowing it a raw material gas by a gas supply member 33, while each substrate 10 introduced from the left side is moved toward the right side as being loaded on a substrate holder 31. When mono-silane (SiH$_4$) is used as the raw material gas and it is reacted with oxygen, silicon dioxide (SiO$_2$) can be grown as the CVD film 11. Another type of CVD system, e.g., a horizontal type, a vertical type, diffusion furnace type or the like, other than the one type used in the embodiment can be also used. If mono-silane (SiH$_4$) and ammonia (NH$_3$) are supplied as the raw material gas while they are heated at a temperature of 700°–900° C. under a low pressure of 0.1 to 10 Torr, silicon nitride (Si$_3$N$_4$) can be grown as the CVD film 11.

While growing the CVD film 11 on the chamfered substrate 10, the raw material gas reaches not only the rear surface but the main surface side of the substrate 10 through the space formed between the chamfered portion of the substrate 10 and the substrate holder 31. As a result, the raw material gas reaches the main surface beveled portion 10a to grow a CVD film 11 thereon. Such a state is illustrated in FIG. 1A.

Figure 3:
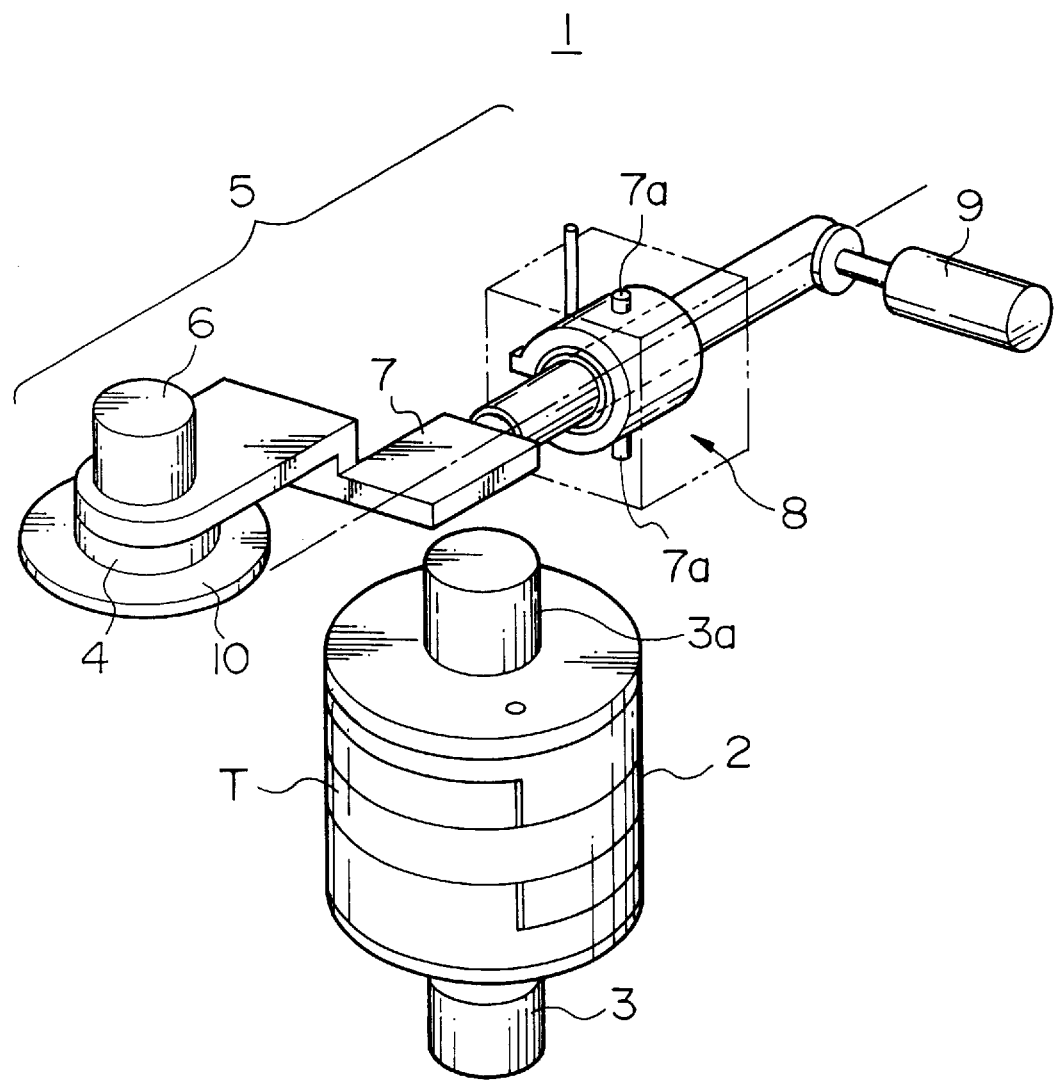
FIG. 3 is a perspective view showing an embodiment of the abrasive tape grinding apparatus used for the invention.

Next, after the silicon single crystal substrate 10 having the CVD film 11 grown thereon is taken out of the CVD system 30, the portion of the CVD film 11 in the side of the main surface beveled portion 10a, which was grown by reaching of the raw material gas thereto over the peripheral side surface 10c of the substrate 10, is removed by using the abrasive tape grinding apparatus 1 shown in FIG. 3. Such a state is illustrated in FIG. 1B.

Tape polishing is carried out by rotating the substrate 10 at a rotational speed of 500–900 rpm while pressing a tape T which is composed of a polyester film and fixed abrasive grains of silicon carbide each having a diameter of 3–9 μm held on the polyester film through an adhesive or the like, against the grown portion of the CVD film 11 on the main surface beveled portion 10a, which was grown by reaching of the raw material gas thereto over the peripheral side surface of the substrate 10.

When the diameter of fixed abrasive grains is larger than 9 μm, an additional step for removing larger damages caused by the grinding, by etching with an alkali aqueous solution, e.g., KOH aqueous solution or the like, is required after the abrasive tape grinding. On the other hand, the diameter of fixed abrasive grains smaller than 3 μm is not practical because much time is required for the tape polishing.

The abrasive tape grinding with the rotational speed of the substrate 10, of 500–900 rpm enables grinding a wafer in only 20 to 40 seconds. On the contrary, the buff polishing requires about 240 seconds, in order to remove the grown portion of the CVD film 11 on the main surface beveled portion 10a of a substrate having a diameter of 125 mm.

According to using such abrasive tape grinding, because the used portion of the tape T is taken up by the take-up reel and therefore the substrate 10 is always ground by fresh surfaces of the tape T supplied continuously, during grinding, there is no problem of occurrence of wear or glazing of fixed abrasive grains. Therefore, time for exchanging a grinding stone is not required and accordingly the method using the abrasive tape grinding is efficient.

Finally, the main surface of the silicon single crystal substrate 10 in which the grown portion of the CVD film 11 in the side of the main surface beveled portion 10a was removed, is mirror-polished by a mechanochemical method. As the result, a silicon single crystal substrate for the use of an epitaxial layer growth is obtained.

An epitaxial layer 12 with a carrier concentration of $1 \times 10^{16}$ atoms/cm$^3$, having a thickness of about 6 μm, was grown on the silicon single crystal substrate 10 for the use of an epitaxial layer growth, by adding phosphorus (P) as dopants. As a result, the epitaxial layer 12 was formed on the main surface and on the main surface beveled portion 10a, of the silicon single crystal substrate 10, as shown in FIG. 1C.

Because the portion of the CVD film on the main surface beveled portion 10a, which had been grown by reaching of the raw material gas thereto over the peripheral end of the substrate, was surely removed by the abrasive tape grinding, there was no problem of occurrence of nodules. Further, any faults due to working damage, e.g., stacking faults, slip dislocations or the like, were not generated in the grown epitaxial layer. Because a CVD film remains surely on the other beveled portion 10b, the peripheral side portion 10c and the rear surface of the substrate 10, it is possible to prevent occurrence of autodoping sufficiently. On the contrary, if an epitaxial layer is grown on a silicon single crystal substrate, from the main surface beveled portion 10a of which the CVD film 11 is not removed, nodules come to generate on the main surface beveled portion 10a.

Figure 2A:
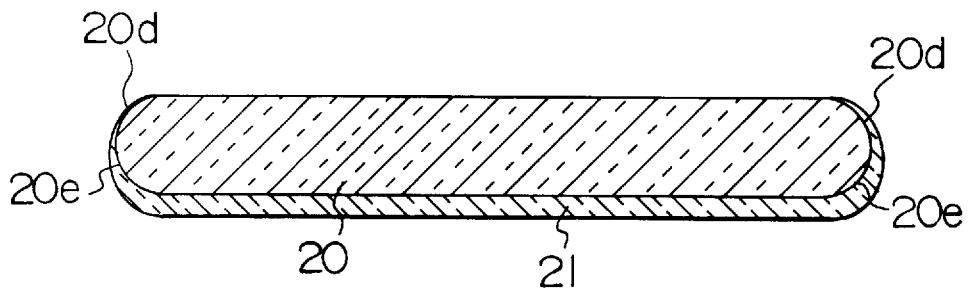
FIGS. 2A to 2C are vertical sectional views for showing steps for manufacturing a silicon single crystal substrate which is used for growing an epitaxial layer thereon in vapor phase, according to a second embodiment of the invention.
Figure 2B:
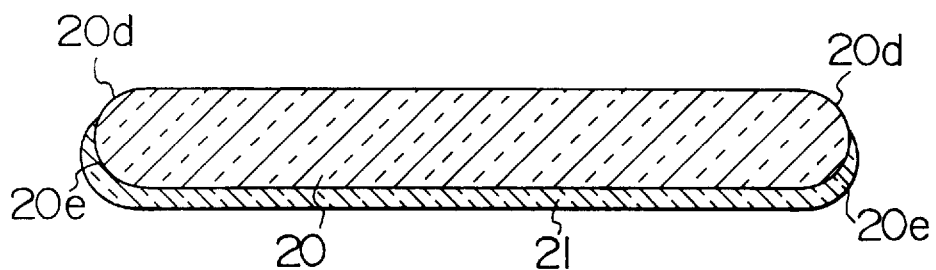
Figure 2C:
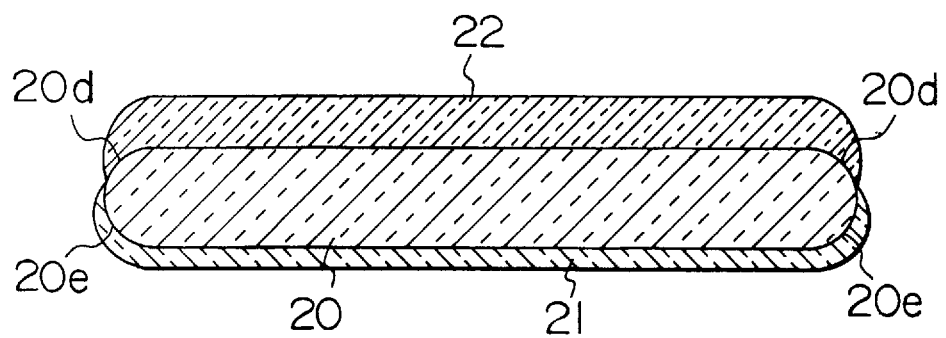

A second embodiment of the invention is shown in FIGS. 2A to 2C. In the second embodiment, as a silicon single crystal substrate for use of an epitaxial layer growth, one having an arc-shaped peripheral section is used.

To the silicon single crystal substrate 20 having such an arc-shaped peripheral section 20d and 20e, after a chemical etching treatment for removing a working damage is carried, a CVD film 21 of an oxide or a nitride for preventing autodoping is formed on the rear and side surfaces of the substrate 20, under approximately the same condition as that of the first embodiment.

While growing the CVD film 21 on the substrate 20, the raw material gas reaches not only the rear surface and the arc-shaped peripheral portion 20e in the rear surface side but the arc-shaped peripheral portion 20d in the main surface side of the substrate 20. As a result, the CVD film 21 is grown not only on the rear surface and the arc-shaped peripheral portion 20e in the rear surface side but on the arc-shaped peripheral portion 20d in the main surface side. Such a state is illustrated in FIG. 2A.

Next, the CVD film 21 grown on the arc-shaped peripheral portion 20d in the main surface side is removed by using the abrasive tape grinding apparatus 1, like the first embodiment, as shown in FIG. 2B. Thereafter, the main surface of the silicon single crystal substrate 20 in which the CVD film 21 grown on the arc-shaped peripheral portion 20d in the main surface side was removed, is mirror-polished by a mechanochemical method. As the result, a silicon single crystal substrate for the use of an epitaxial layer growth is obtained.

An epitaxial layer 22 with a carrier concentration of $1 \times 10^{16}$ atoms/cm$^3$ having a thickness of about 6 μm is grown on the silicon single crystal substrate for the use of an epitaxial layer growth by adding phosphorus (P) as dopants. As a result, the epitaxial layer 22 is formed on the main surface and on the arc-shaped peripheral portion 20d in the main surface side, of the silicon single crystal substrate 20, as shown in FIG. 2C.

Because the portion of the CVD film on the arc-shaped peripheral portion 20d in the main surface side, which was grown by reaching of the raw material gas thereto over the peripheral end of the substrate, is surely removed by the abrasive tape grinding, there is no problem of occurrence of nodules. Further, any faults due to a working damage, e.g., stacking faults, slip dislocations or the like, are not generated in the grown epitaxial layer. Because a CVD film remains surely on the arc-shaped peripheral portion 20e in the rear surface side and on the rear surface, it is possible to prevent occurrence of autodoping sufficiently.

Although the present invention has been described in its preferred form with a certain degree of particularity, it should also be understood that the present invention is not limited to the preferred embodiment and that various changes and modifications may be made to the invention without departing from the spirit and scope thereof.

For example, in the first embodiment, after the CVD film 11 was formed on the silicon single crystal substrate 10, only the CVD film on the main surface beveled portion 10a is removed. However, the CVD film 11 not only on the main surface beveled portion 10a but on the peripheral side surface 10c may be removed by the tape polishing.

According to the invention, because the portion of a CVD film in the side of the main surface, which was grown by reaching of the raw material gas thereto over the periphery of the substrate, is removed prior to growing an epitaxial layer thereon, and a CVD film on the other beveled portion remains surely, it is possible to prevent occurrence of autodoping sufficiently and to realize a silicon single crystal substrate for use of an epitaxial layer growth, which has no nodule. It is easy to control the boundary between the region of a formed CVD film and the rest region. Further, it is possible to form a peripheral surface with no working damage nor CVD film, and also to reduce the processing time.

What is claimed is:

1. A method for manufacturing a silicon single crystal substrate for use of an epitaxial layer growth, comprising the steps of:

growing a CVD film on a rear surface and a peripheral side portion, of the silicon single crystal substrate;

removing a portion of the CVD film on the peripheral side portion in the vicinity of a main surface of the silicon single crystal substrate, which was grown over an end of the peripheral side portion, by an abrasive tape grinding; and thereafter mirror-polishing the main surface of the silicon single crystal substrate.

2. A method as claimed in claim 1; wherein the abrasive tape grinding is carried out by rotating the silicon single crystal substrate at a rotational speed of 500–900 rpm while pressing a tape having fixed abrasive grains having a diameter of 3–9 μm thereon, against the portion of the CVD film grown on the peripheral side portion in the vicinity of the main surface of the silicon single crystal substrate.

3. A method as claimed in claim 1; wherein the abrasive tape grinding is carried out by rotating the silicon single crystal substrate while pressing a tape having fixed abrasive grains against the portion of the CVD film grown on the peripheral side portion in the vicinity of the main surface of the silicon single crystal substrate wherein a used portion of the tape is taken up and a portion having a fresh surface of the tape is continuously supplied for grinding.

4. A method as claimed in claim 1; wherein the abrasive tape grinding is carried out by using a tape grinding means which comprises: a rotatable drum which includes a tape supplying reel for supplying a tape holding abrasive grains thereon and a take-up reel for taking up a used tape, and around an outer peripheral surface of which the tape is wound; and a substrate holding member for holding the silicon single crystal substrate, which can bring the peripheral portion of the substrate into contact with the tape and can change a tilt angle of the substrate with respect to the tape wound around the rotatable drum.

5. A method as claimed in claim 1; wherein the silicon single crystal substrate contains arsenic with a concentration of $1 \times 10^{19}$ to $1.9 \times 10^{21}$ atoms/cm$^3$ as dopants.

6. A method as claimed in claim 1; wherein the peripheral side portion of the silicon single crystal substrate comprises a main surface side beveled portion, a peripheral side surface portion and a rear surface side beveled portion; and the peripheral side portion in the vicinity of the main surface is the main surface side beveled portion.

7. A method as claimed in claim 1; wherein the peripheral side portion of the silicon single crystal substrate comprises a main surface side beveled portion, a peripheral side surface portion and a rear surface side beveled portion, and the peripheral side portion in the vicinity of the main surface comprises the main surface side beveled portion and the peripheral side surface portion.

8. A method as claimed in claim 1; wherein the peripheral side portion of the silicon single crystal substrate has an arc-shaped section, and the peripheral side portion in the vicinity of the main surface is a half of the arc-shaped section in a side of the main surface.

9. A method as claimed in claim 1, wherein the CVD film comprises one selected from the group consisting of silicon oxide and silicon nitride.

10. A method for manufacturing a silicon single crystal substrate for use of an epitaxial layer growth, comprising the steps of:

growing a silicon dioxide film on a rear surface and a peripheral side portion which comprises a main surface side beveled portion, the peripheral side surface portion and a rear surface side beveled portion, of the silicon single crystal substrate, by a CVD method;

removing the silicon dioxide film grown on the peripheral side portion in the vicinity of a main surface of the silicon single crystal substrate over an end of the peripheral side portion, by rotating the silicon single crystal substrate while pressing a tape having fixed abrasive grains thereon against the portion of the silicon dioxide film grown on the main surface side beveled portion or the peripheral side surface portion of the silicon single crystal substrate; and thereafter mirror-polishing the main surface of the silicon single crystal substrate.

11. A method as claimed in claim 10; wherein the abrasive tape grinding is carried out by rotating the silicon single crystal substrate at a rotational speed of 500–900 rpm while pressing a tape having fixed abrasive grains having a diameter of 3–9 μm thereon, against the portion of the silicon dioxide film grown on the main surface side beveled portion or the peripheral side surface portion of the silicon single crystal substrate.

12. A method as claimed in claim 10; wherein the abrasive tape grinding is carried out by rotating the silicon single crystal substrate while pressing a tape having fixed abrasive grains against the portion of the silicon dioxide film grown on the peripheral side portion in the vicinity of the main surface of the silicon single crystal substrate wherein a used portion of the tape is taken up and a portion having a fresh surface of the tape is continuously supplied for grinding.

13. A method as claimed in claim 10; wherein the abrasive tape grinding is carried out by using a tape grinding means which comprises: a rotatable drum which includes a tape supplying reel for supplying a tape holding abrasive grains thereon and a take-up reel for taking up a used tape, and around an outer peripheral surface of which the tape is wound; and a substrate holding member for holding the silicon single crystal substrate, which can bring the peripheral portion of the substrate into contact with the tape and can change a tilt angle of the substrate with respect to the tape wound around the rotatable drum.

14. A method as claimed in claim 10; wherein the silicon single crystal substrate contains arsenic with a concentration of $1 \times 10^{19}$ to $1.9 \times 10^{21}$ atoms/cm$^3$ as dopants.

* * * * *